US007559143B2

(12) United States Patent
Hou et al.

(10) Patent No.: US 7,559,143 B2
(45) Date of Patent: Jul. 14, 2009

(54) METHOD FOR MANUFACTURING A HEAT PIPE

(75) Inventors: Chuen-Shu Hou, Tu-Cheng (TW);
Chao-Nien Tung, Tu-Cheng (TW);
Tay-Jian Liu, Tu-Cheng (TW);
Cheng-Chi Lee, Tu-Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 227 days.

(21) Appl. No.: 11/309,185

(22) Filed: Jul. 7, 2006

(65) Prior Publication Data

US 2007/0074396 A1 Apr. 5, 2007

(30) Foreign Application Priority Data

Sep. 23, 2005 (CN) .................. 2005 1 0037485

(51) Int. Cl.
*B21D 53/06* (2006.01)
*B23P 17/00* (2006.01)
(52) U.S. Cl. .................. 29/890.032; 29/890.036; 29/458; 29/527.2; 419/5
(58) Field of Classification Search ............ 29/890.032, 29/890.036, 890.053, 458, 527.2; 419/1, 419/5, 8; 165/104.26
See application file for complete search history.

(56) References Cited

U.S. PATENT DOCUMENTS 4,128,074 A * 12/1978 Rejsa .................... 118/24

| | | | |
|---|---|---|---|
| 5,356,665 A * | 10/1994 | Seki et al. .................. 427/239 |
| 5,743,014 A * | 4/1998 | Giammaruti et al. ... 29/890.032 |
| 6,029,742 A * | 2/2000 | Burward-Hoy ............ 165/80.4 |
| 6,508,302 B2 * | 1/2003 | Ishida et al. ........... 165/104.26 |
| 6,811,745 B2 * | 11/2004 | Forsberg et al. ............... 419/10 |
| 6,880,647 B2 * | 4/2005 | Villareal ....................... 175/40 |
| 7,137,201 B2 * | 11/2006 | Brodt et al. ................ 29/897.2 |

FOREIGN PATENT DOCUMENTS

JP       57142485 A  *  9/1982
JP       57142486 A  *  9/1982

* cited by examiner

*Primary Examiner*—Jermie E Cozart
(74) *Attorney, Agent, or Firm*—Frank R. Niranjan (57) ABSTRACT

A powder feeding apparatus and a method of manufacturing a heat pipe are disclosed. The method includes: a) proving the powder feeding apparatus including a vibrating tray and a pump (800); b) positioning a tube in the vibrating tray; c) inserting a mandrel (400) into the tube from a first open end of the tube, wherein at least one groove (410) is defined in an end of the mandrel corresponding to a second open end of the tube; d) positioning a feeder (300) on the first end of the tube; e) driving the vibrating tray to vibrate and feeding powder into the tube from the feeder whilst the pump is operating to generate a forced airflow flowing from the first to the second open end of the tube. By using this method, bridging of the powder is prevented.

13 Claims, 7 Drawing Sheets

METHOD FOR MANUFACTURING A HEAT PIPE

FIELD OF THE INVENTION

The present invention relates generally to an apparatus and a method of manufacturing a heat pipe, and more particularly to a powder feeding apparatus and a method of feeding powder into a heat pipe having a sintered wick structure for use with the powder feeding apparatus.

DESCRIPTION OF RELATED ART

Heat pipes have excellent heat transfer properties and therefore are an effective means for transfer or dissipation of heat from heat sources. Heat pipes are widely used for removing heat from heat-generating components such as computer central processing units (CPUs). A heat pipe is usually a vacuum tube containing a working fluid therein, which is employed to carry thermal energy from one section of the heat pipe (typically referred to as the "evaporating section") to another section thereof (typically referred to as the "condensing section") via phase transitions between a liquid state and a vapor state. The tube is made of a highly thermally conductive material such as copper or aluminum. Preferably, a wick structure is provided inside the heat pipe, lining an inner wall of the tube, for drawing the working fluid back to the evaporating section after it has condensed in the condensing section. Specifically, as the evaporating section of the heat pipe is maintained in thermal contact with a heat-generating component, the working fluid contained in the evaporating section can absorb heat generated by the heat-generating component, turning into vapor as a result. Due to the difference in vapor pressure between the two sections of the heat pipe, the vapor moves towards the condensing section where the vapor is condensed into liquid, releasing the heat into ambient environment in the process; the heat is then dispersed by, for example, fins thermally contacting the condensing section. Due to the difference of capillary pressure in the wick structure between the two sections, the condensed liquid is then drawn back by the wick structure to the evaporating section where it is again available for evaporation.

The wick structures currently used in heat pipes include fine grooves integrally defined in the inner wall of the tube, screen mesh or bundles of fiber inserted into the tube and held against the inner wall thereof, or sintered powder combined to the inner wall by a sintering process. Of these structures, the sintered powder wick is considered to be the best as the other wicks cannot match the heat transfer and capillary action abilities of the sintered powder wick.

It is well-known that physical characteristics of the sintered powder wick structure (such as porosity and pore size distribution) determine the thermal performance of the heat pipe. Packing density of the powder before being sintered can also enormously affect the thermal performance of the heat pipe. The packing density of the powder before being sintered can determine the sintering temperature, intensity, porosity, pore size, permeability and capillary force of the wick structure.

Currently, a conventional method for making a sintered powder wick includes feeding a powder or mix of powder into a hollow tube which has a closed end and an open end. However, the powder feeding process is generally done by hand, which can result in a low manufacturing yield and an uneven packing density of the powder in the tube.

Figure 6:
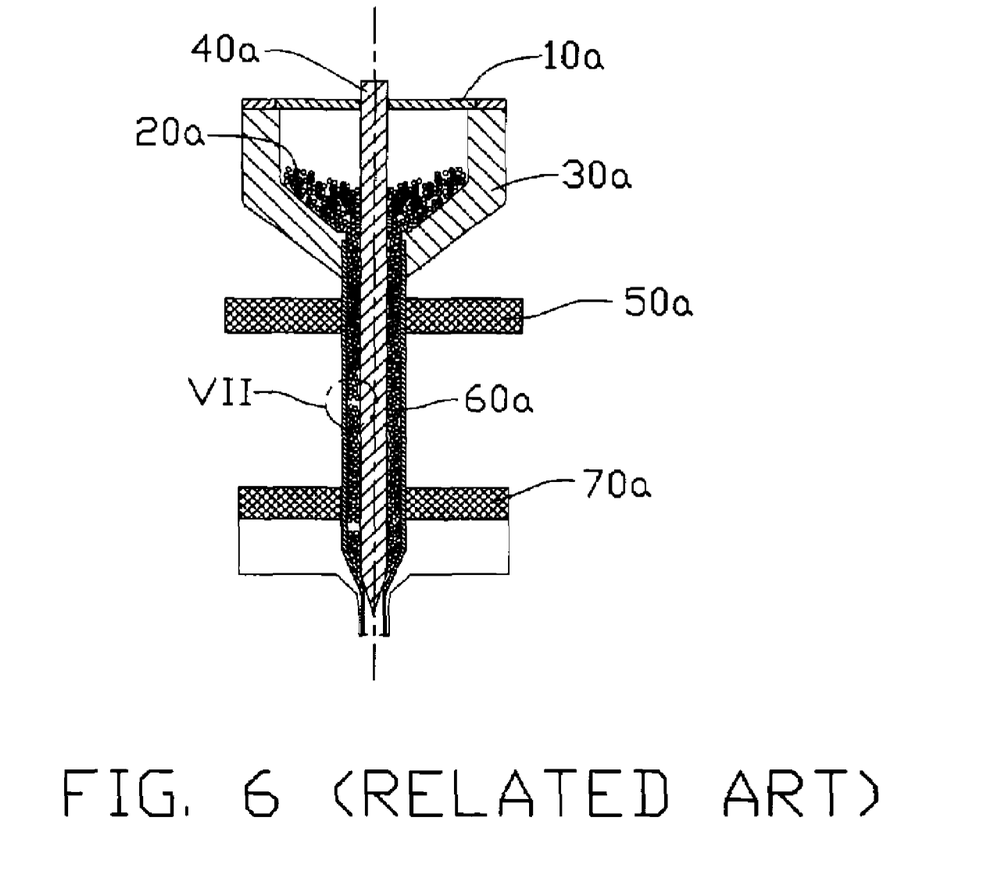
FIG. 6 is a longitudinal cross-sectional view of a powder feeding apparatus in accordance with the prior art.
Figure 7:
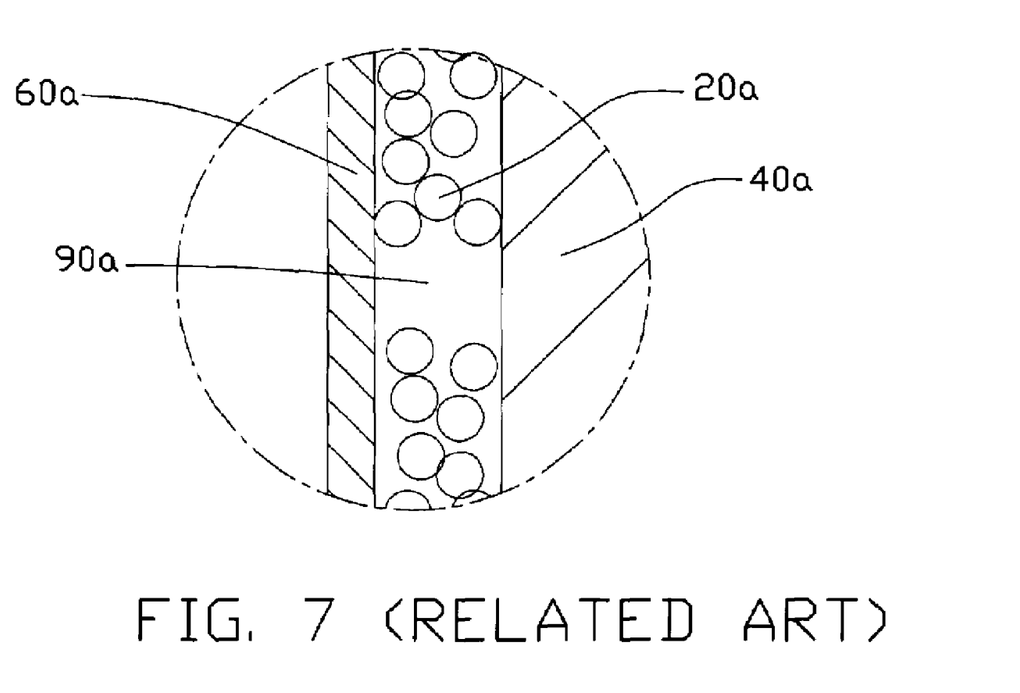
FIG. 7 is an enlarged view of a circled portion VII of FIG. 6.

In order to overcome the disadvantages of the manual powder feeding process, mechanical systems can be used to feed the powder into the hollow tube. Referring to FIG. 6 a conventional powder feeding apparatus for manufacturing a heat pipe is illustrated. The powder feeding apparatus is used for feeding a powder 20a into a hollow tube of a heat pipe 60a. The powder feeding apparatus includes a vibrating tray connected with a vibrating source. The vibrating tray includes an upper supporting plate 50a and a lower supporting plate 70a. The upper and lower supporting plates 50a, 70a each define a plurality of locating holes (not labeled). The tube is interferentially engaged in two corresponding locating holes of the upper and lower supporting plates 50a, 70a and is positioned on the upper and lower supporting plates 50a, 70a. A mandrel 40a is inserted into the tube through an upper open end of the tube. A funnel/hopper 30a providing an inlet for the powder 20a is mounted on the upper end of the tube of the heat pipe 60a. A lid 10a is mounted on the funnel 30a. A central hole is defined in the lid 10a. The mandrel 40a is interferentially engaged in the central hole of the lid 10a. When in use the funnel 30a is filled or partially filled with the powder 20a, the vibrating tray then vibrates in a designed direction and the powder 20a slides into a space defined between the mandrel 40a and the tube of the heat pipe 60a. However, during the process of feeding the powder 20a into the tube, bridging of the powder 20a often occurs because of the physical characteristics of the powder 20a such as porosity, size, shape, etc, which as a result hampers the flow of the powder 20a. Referring to FIG. 7, voids 90a are defined between the powder 20a, which reduces the heat pipe 60a capillary force and affects consistency of the powder 20a. A performance of the heat pipe 60a is reduced accordingly.

Therefore, it is desirable to provide a powder feeding apparatus and a method of manufacturing a heat pipe using the powder feeding apparatus to prevent a bridging of powder. A bridging is a compaction of the powder in the tube of the heat pipe which can interfere with the flow of the powder in the tube.

SUMMARY OF THE INVENTION

A powder feeding apparatus for manufacturing a heat pipe in accordance with an embodiment of the present invention comprises a vibrating tray having a supporting plate. A vibrating source is connected to the supporting plate, for driving the vibrating tray to vibrate. A tube having a first open end and a second open end is positioned in the supporting plate of the vibrating tray. A mandrel is coaxially inserted into the tube from the first open end, comprising a cylindrical core and a lower end extending into the second open end. The lower end of the mandrel defines a groove therein. A feeder is located at the first end of the tube for feeding powder into the tube. A lid is mounted on the feeder, and an upper end of the mandrel is interferentially engaged in the lid. A pump is connected to the second end of the tube. The vibrating tray vibrates whilst the pump is operating, and forced air is provided in the tube to drive the powder enter into a space between an inner surface of the tube and an outer surface of the mandrel, whereby a bridging of the powder is prevented. The forced air generated by the pump flows from the first end to the second end of the tube.

The present invention in another aspect, relates to a method of manufacturing a heat pipe. The method includes the following steps: (1) providing a tube having first and second open ends; (2) filling (i.e. either partially or wholly) the tube with powder from the first open end; (3) sintering the powder in the tube; (4) extracting the mandrels from the pipes, filling the tube with working medium, vacuuming and sealing the tube. Step (2) includes the following steps: (a) proving a vibrating tray and a pump, the vibrating tray connecting with a vibrating source; (b) positioning the tube in the vibrating tray; (c) inserting a mandrel into the tube from the first open end, where at least one groove is defined in an end of the mandrel corresponding to the second open end of the tube in a manner so as to provide an unblocked channel defined between an outer surface of the mandrel and an inner surface of the tube; (d) positioning a feeder on the first opening of the tube; (e) starting the vibrating source to drive the vibrating tray to vibrate and feeding powder into the tube from the feeder whilst the pump is operating to generate a forced air flowing from the first open end to the second open end. By using this method, bridging of the powder is prevented.

Other advantages and novel features of the present invention will become more apparent from the following detailed description of the embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
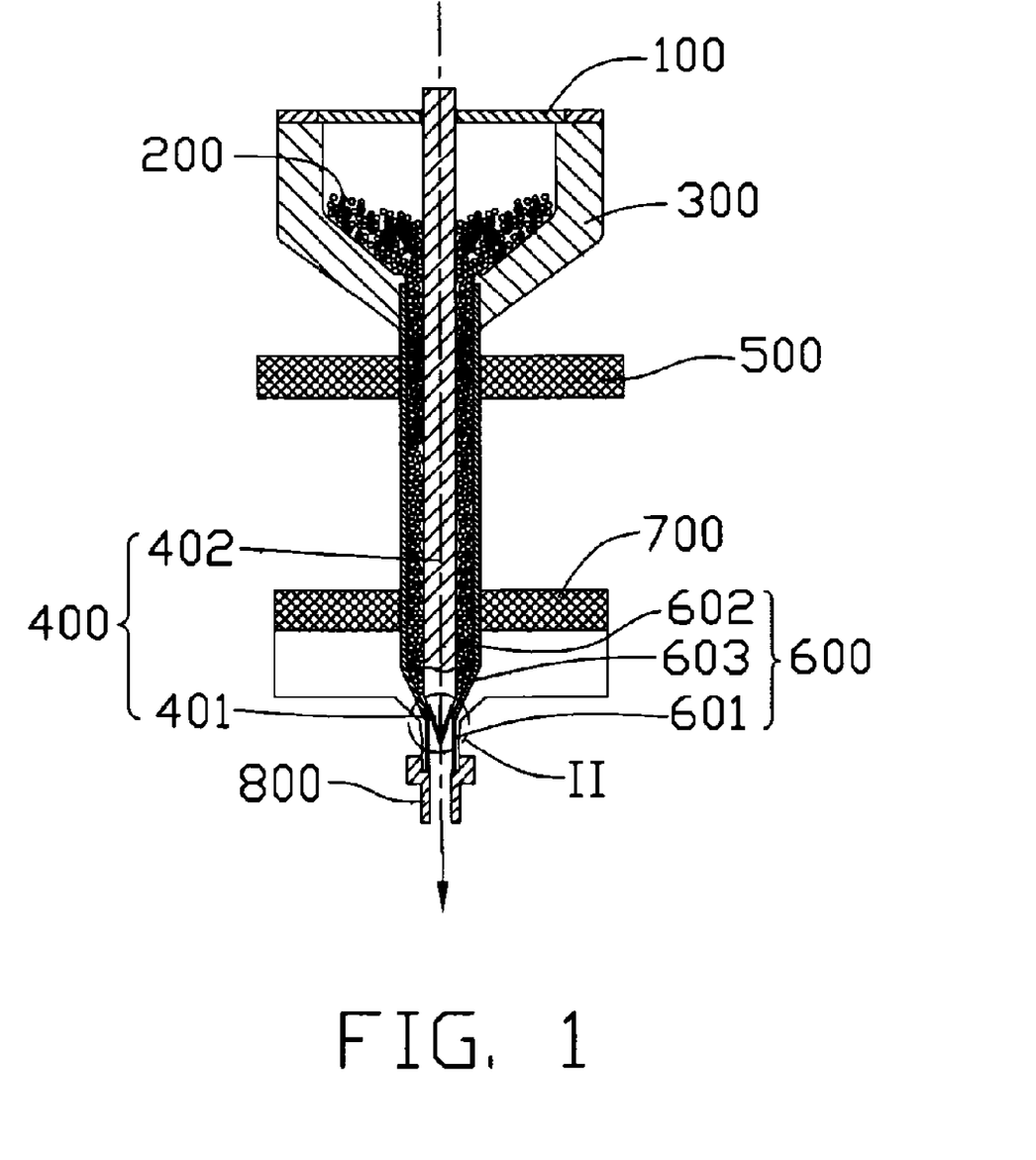
FIG. 1 is a longitudinal cross-sectional view of a powder feeding apparatus in accordance with an embodiment of the present invention.

Referring to FIG. 1, a method of manufacturing a heat pipe in accordance with an embodiment of the invention includes following steps:

providing a tube 600 having two opposite upper and lower open ends;

powder 200 such as copper or aluminum powder into the tube 600 from the upper open end;

the filled powder 200 together with the tube 600 at a high temperature, whereby the filled powder 200 are sintered and diffusion bonded to an inner surface of the tube 600; the upper open end of the tube 600;

filling the tube 600 with a quantity of working fluid from the lower open end of the tube 600;

filling air in the tube 600 to a pre-determined low-pressure vacuum from the lower open end, and then sealing the lower open end to form the heat pipe.

FIG. 1 particularly shows a powder feeding apparatus for performing step (2) in accordance with an embodiment of the present invention. The powder feeding apparatus comprises a vibrating tray (not labeled) connected with a vibratory source (not shown), the tube 600, a mandrel 400, a funneled feeder 300, a lid 100 and a pump 800.

The vibrating tray comprises an upper supporting plate 500 and a lower supporting plate 700. The upper and lower supporting plates 500, 700 each define a plurality of locating holes (not labeled).

The tube 600 passes through two corresponding locating holes defined in the upper and lower supporting plates 500, 700 and is interferentially engaged in the two corresponding locating holes, whereby the tube 600 is positioned on the upper and lower supporting plates 500, 700. The tube 600 comprises a cylindrical body 602, a lower open portion 601 connecting the pump 800 and a tapered portion 603 interconnecting the cylindrical body 602 and the lower open portion 601. The tapered portion 603 gradually reduces in diameter towards the lower open portion 601. A knee portion 604 (shown in FIG. 2) is formed at a joint of the tapered portion 603 and the lower open portion 601.

The mandrel 400 is coaxially inserted into the tube 600 through the upper open end of the tube 600. The mandrel 400 has a cylindrical core 402 and a lower end 401. The lower end 401 has a conical shape, which means that the lower end 401 gradually reduces in diameter from top-to-bottom, wherein a maximum diameter of the lower end 401 is greater than that of the lower open portion 601 of the tube 600, thus preventing the mandrel 400 from sliding out of the tube 600. Also referring to FIG. 2, a plurality of grooves 410 extending in an axial direction are defined in a circumferential outer surface of the lower end 401 of the mandrel 400. There are gaps between the knee portion 604 of the tube 600 and the circumferential outer surface of the lower end 401 of the mandrel 400 due to the grooves 410 being defined in the lower end 401. The diameter of each powder particle 400 is greater than a width of each gap, thereby preventing the powder 400 sliding out of the tube 600 from the gap. One part of the lower end 401 of the mandrel 400 having the grooves 410 extends into the lower open portion 601 of the tube 600, whereby the grooves 410 extend through the tapered portion 603 and the lower open portion 601 of the tube 600. Each powder particle 400 has a diameter greater than a width of each of the grooves 410 in a circumferential direction. The width of each of the grooves 410 is, for example, about 20~100 (m, wherein 50~80 (m is preferable, thus preventing the powder particle from becoming embedded in the grooves 410.

The funneled feeder 300 is mounted on the upper open end of the tube 600. The lid 100 is mounted on the funneled feeder 300. A central hole (not labeled) is defined in the lid 100. The core 402 of the mandrel 400 passes through the central hole of the lid 100 and is interferentially engaged in the central hole so that the mandrel 400 is positioned on the lid 100. A plurality of through holes (not shown) are defined in the lid 100 around the central hole to facilitate airflow. The pump 800 is mounted in the lower open portion 601.

In use, the vibratory source drives the tray to vibrate in a direction perpendicular to the axes of the tube 600. At the same time, the pump 800 is operated to pump out air in the tube 600 so that the air is forced to flow in a top-to-bottom direction. In this fashion, the powder 200 fills a space between the mandrel 400 and the tube 600.

Figure 2:
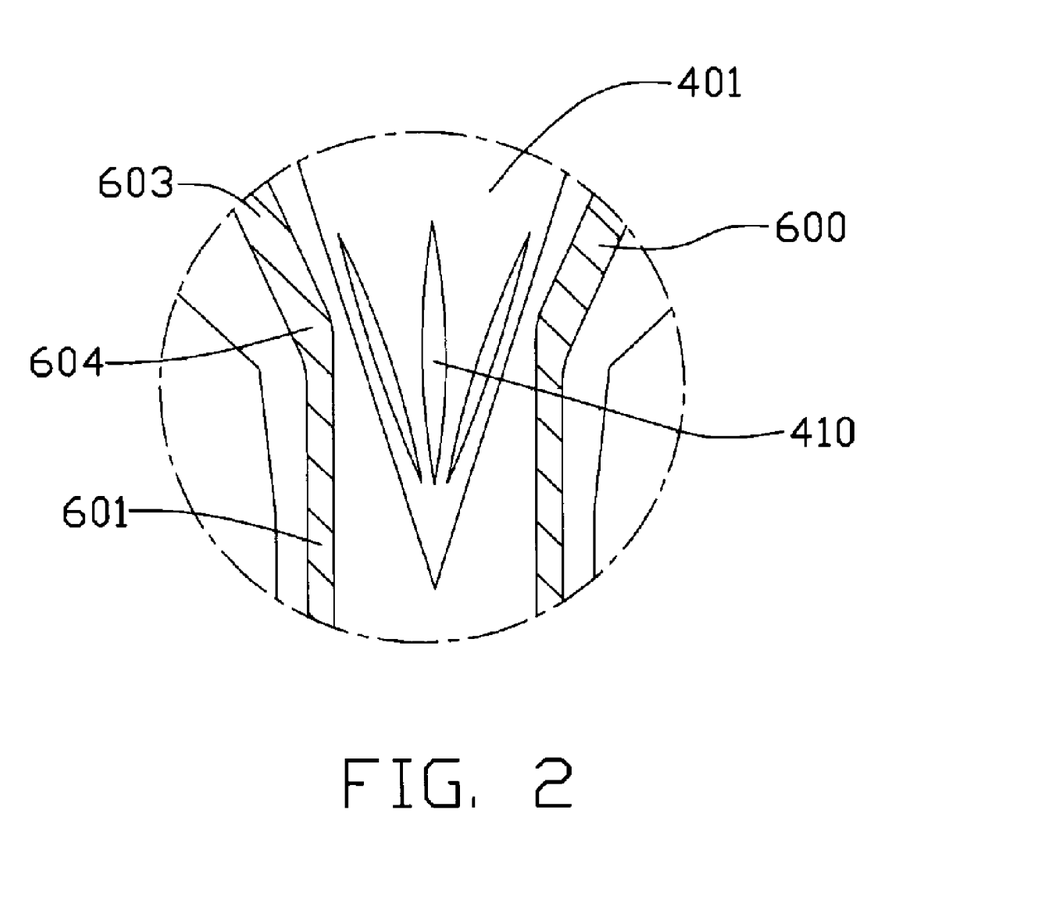
FIG. 2 is an enlarged view of a circled portion II of FIG. 1.

In the present embodiment, the diameter of each powder particle 400 is greater than the width of each groove 410, thereby the powder 200 is prevented from entering the grooves 410 and blocking airflow in the tube 600. Thus an unblocked channel is defined between the circumferential outer surface of the mandrel 400 and an inner surface of the tube 600. The forced air is forced to flow through the unblocked channel to drive the powder 200 to flow in a top-to-bottom direction whilst the pump is operating. As a result, a bridging of the powder 400 is prevented and air pollution caused by the powder 200 escaping from the apparatus is also prevented.

Figure 3:
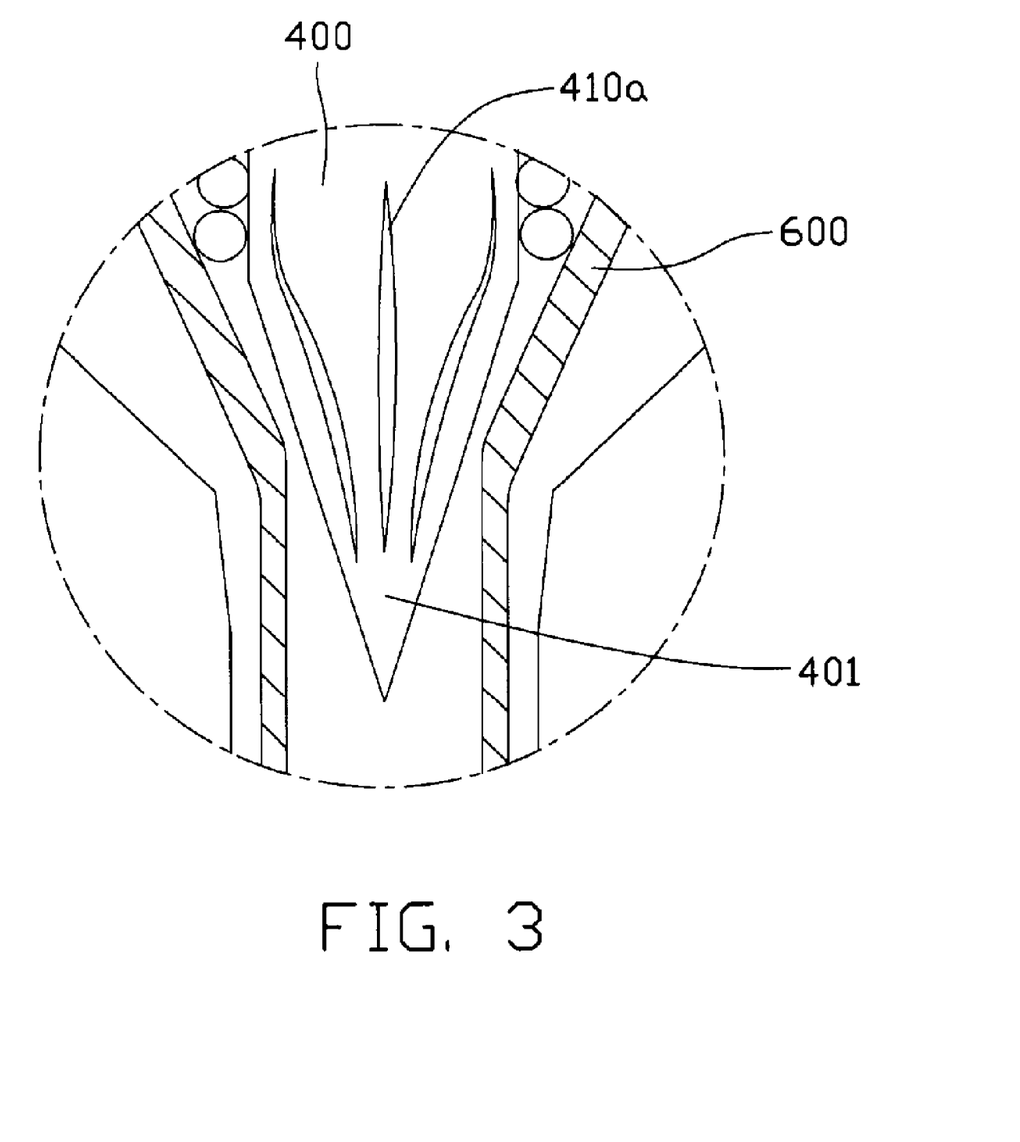
FIG. 3 is an enlarged view similar to FIG. 2 in accordance with a second embodiment of the present invention.

FIG. 3 shows a powder feeding apparatus in accordance with a second embodiment of the invention. The powder feeding apparatus of the second embodiment is similar to that of the previous embodiment. However, grooves 410*a* replace the grooves 410 of the mandrel 400 of the previous embodiment. In the second embodiment, the grooves 410*a* are longer than each of the grooves 410 of the previous embodiment. Upper ends of the grooves 410*a* are parallel and extend upwardly beyond the lower end 401 of the mandrel 400 for facilitating airflow.

Figure 4:
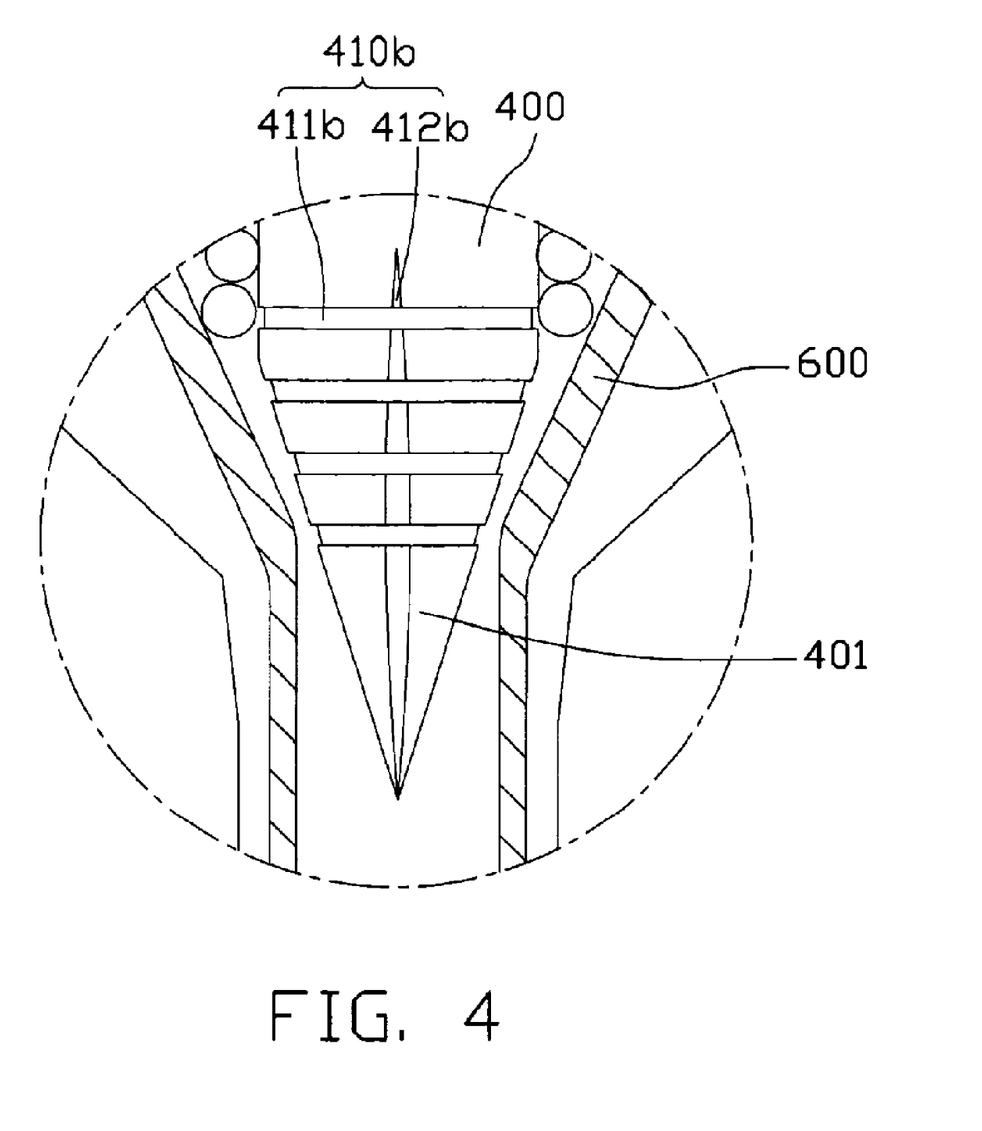
FIG. 4 is an enlarged view similar to FIG. 2 in accordance with a third embodiment of the present invention.

FIG. 4 shows a powder feeding apparatus in accordance with a third embodiment of the invention. The powder feeding apparatus of the second embodiment is similar to that of the previous embodiment. However, grooves 410*b* replaces the grooves 410 of the mandrel 400 of the previous embodiment. In the third embodiment, grooves 410*b* comprises a plurality of parallel annular slots 411*b* circumferentially defined in an outer surface of the lower end 401 of the mandrel 400 and at least one axial groove 412*b* extending across the annular slots 411*b*.

Figure 5:
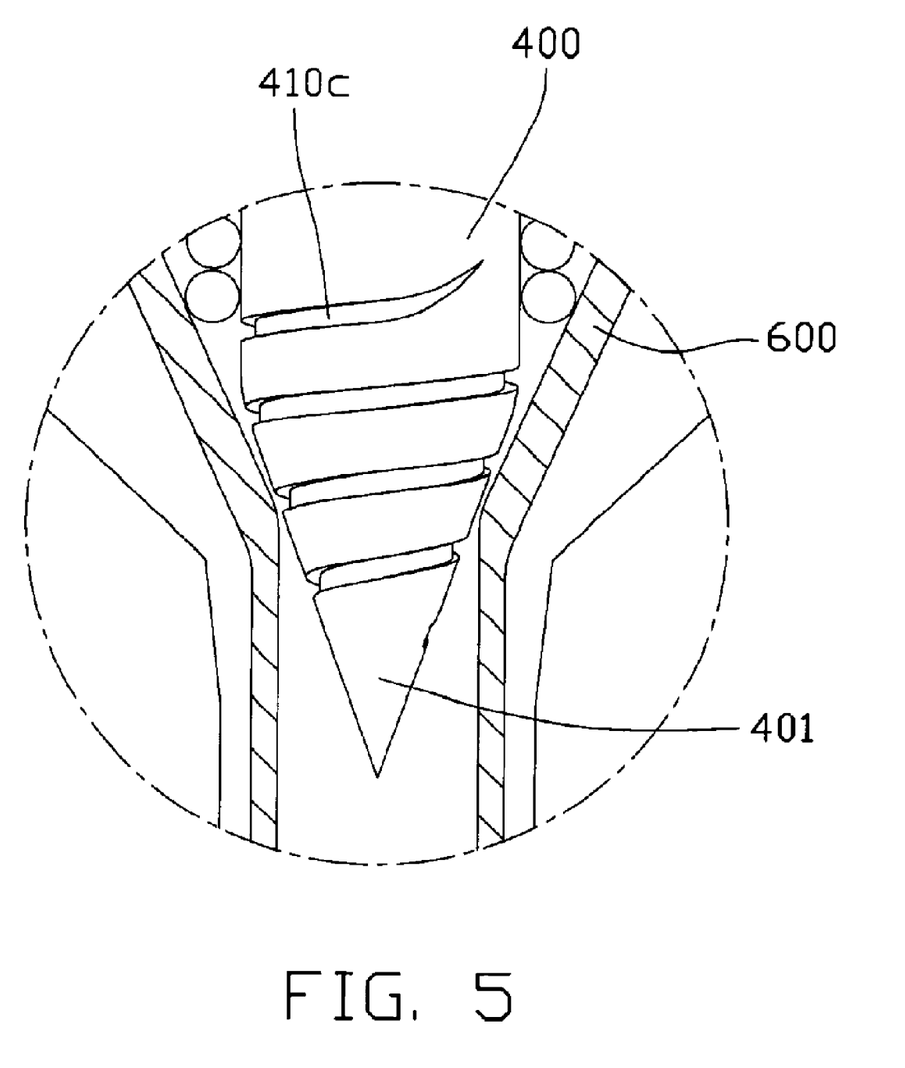
FIG. 5 is an enlarged view similar to FIG. 2 in accordance with a fourth embodiment of the present invention.

FIG. 5 shows a powder feeding apparatus in accordance with a fourth embodiment of the invention. The powder feeding apparatus of the fourth embodiment is similar to that of the previous embodiment. However, grooves 410*c* replace the grooves 410 of the mandrel 400 of previous embodiment. In the fourth embodiment, the grooves 410*c* have a spiral shape.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of manufacturing a heat pipe, comprising steps of:
   I) providing a tube having first and second open ends;
   II) filling the tube with powder through the first open end, this filling step including sub-steps of:
      a) providing a vibrating tray and a pump connected to the second open end, the vibrating tray connecting with a vibrating source;
      b) positioning the tube in the vibrating tray;
      c) inserting a mandrel into the tube from the first open end, where at least one groove is defined in an end of the mandrel corresponding to the second open end of the tube to provide an unblocked air channel defined between an outer surface of the mandrel and an inner surface of the tube;
   d) positioning a feeder on the first open end of the tube;
   e) starting the vibrating source to drive the vibrating tray to vibrate and feeding the powder into the tube from the feeder whilst the pump is operating to generate a forced airflow flowing from the first open end to the second open end of the tube;
   III) sintering the powder of the tube to form a wick structure, sealing the first open end of the tube;
   IV) extracting the mandrel from the tube, filling the tube with working medium, and vacuuming and sealing the second open end of the tube.

2. The method of manufacturing a heat pipe as in claim 1, wherein a diameter of each powder particle is greater than a width of the at least one groove.

3. The method of manufacturing a heat pipe as in claim 1, wherein the mandrel has a cylindrical core and a lower end having a conical shape, and the at least one groove is defined in the lower end of the mandrel.

4. The method of manufacturing a heat pipe as in claim 3, wherein the at least one groove is defined in an outer surface of the lower end and extends in an axial direction.

5. The method of manufacturing a heat pipe as in claim 4, wherein the at least one groove extends towards the core and beyond the lower end of the mandrel.

6. The method of manufacturing a heat pipe as in claim 4, wherein another annular slot is circumferentially defined in the lower end of the mandrel and the at least one groove extends across the another annular slot.

7. The method of manufacturing a heat pipe as in claim 3, wherein the tube has a cylindrical body, a lower open portion connecting the pump and a tapered portion interconnecting the cylindrical body and the lower open portion.

8. The method of manufacturing a heat pipe as in claim 7, wherein the lower end of the mandrel extends into the lower open portion of the tube, and the lower end of the mandrel has at least a portion with a diameter which is greater than that of the lower open portion of the tube.

9. The method of manufacturing a heat pipe as in claim 3, wherein the at least one groove has a spiral shape.

10. The method of manufacturing a heat pipe as in claim 1, wherein the vibrating tray comprises upper and lower supporting plates each defining a plurality of through holes therein, the tube being interferentially engaged in two corresponding through holes of the upper and lower plates.

11. The method of manufacturing a heat pipe as in claim 1, wherein the feeder has a funneled shape.

12. The method of manufacturing a heat pipe as in claim 1, wherein step d) further comprises providing a lid mounted on the feeder.

13. The method of manufacturing a heat pipe as in claim 12, wherein the lid defines a central hole and a plurality of through holes around the central hole, an upper end of the mandrel being interferentially engaged in the central hole.

* * * * *